United States Patent [19]

Adams et al.

[11] 4,024,944
[45] May 24, 1977

[54] SEMICONDUCTOR SLICE PREALIGNMENT SYSTEM

[75] Inventors: Anthony Lionel Adams, McKinney; Claude Dedmond Head, III, Dallas, both of Tex.

[73] Assignee: Texas Instruments Incorporated, Dallas, Tex.

[22] Filed: Dec. 24, 1975

[21] Appl. No.: 644,225

[52] U.S. Cl. ............................ 198/394; 198/395; 198/414; 302/2 R
[51] Int. Cl.² ........................................ B65G 47/24
[58] Field of Search .......... 198/237, 239, 241, 245, 198/257, 261, 262, 19, 379, 394, 395, 401, 414; 250/235, 578, 548; 302/2 R

[56] References Cited

UNITED STATES PATENTS

| | | | |
|---|---|---|---|
| 3,289,808 | 12/1966 | Simmons | 198/262 X |
| 3,297,134 | 1/1967 | Pastuszak | 198/257 X |
| 3,312,325 | 4/1967 | Beck et al. | 198/239 |
| 3,439,792 | 4/1969 | Frank et al. | 198/394 |
| 3,603,646 | 9/1971 | Leoff | 198/241 X |
| 3,645,581 | 2/1972 | Lasch, Jr. et al. | 302/2 R |
| 3,812,947 | 5/1974 | Nygaard | 198/19 |
| 3,820,647 | 6/1974 | Waugh, Jr. et al. | 198/395 |
| 3,865,254 | 2/1975 | Johannsmeir | 198/257 X |
| 3,890,508 | 6/1975 | Sharp | 198/257 X |
| 3,930,684 | 1/1976 | Lasch, Jr. et al. | 198/257 X |
| 3,982,627 | 9/1976 | Isohata | 198/380 |

OTHER PUBLICATIONS

Vol. 14, No. 4, IBM Technical Disclosure Bulletin, p. 1021, Sept. 1971.
Vol. 18, No. 8, IBM Technical Disclosure Bulletin, pp. 2529–2530, Jan. 1976.

*Primary Examiner*—John J. Love
*Assistant Examiner*—Richard K. Thomson
*Attorney, Agent, or Firm*—Harold Levine; James T. Comfort; James O. Dixon

[57] ABSTRACT

A system for the alignment and orientation of disc-like objects having transport means to move the object gently onto a turntable and against an arcuate resilient stop to a centered position on the turntable; an array of non-contact sensors is advanced toward the rotational axis of the turntable until one of the sensors detects the edge of the object; the turntable is rotated until the sensors detect an indexing flat on the object; the sensor arrays advance and the turntable rotated until the sensors indicate the desired alignment and orientation of the object has been achieved. Logic circuitry controls the sensor and turntable positions automatically in response to signals received from the sensors.

51 Claims, 10 Drawing Figures

SEMICONDUCTOR SLICE PREALIGNMENT SYSTEM

This invention relates to automatic semiconductor slice processing machines and more particularly to machines for automatically prealigning or orienting semiconductor slices prior to manual microscope-aided final alignment of slices preparatory to producing a patterned etching mask on the slice by photographic techniques.

By modern semiconductor manufacturing techniques, a large number of devices, either integrated circuits or discrete devices, are manufactured on a single slice or wafer of semiconductor material usually 2 to 3 inches in diameter and about 18 thousandths of an inch thick. The slices are later cut into individual devices which are packaged in individual enclosures to make the finished device. During the processing of each slice, several patterned etching steps must be performed. The patterns are applied by coating the slice with a photosensitive film which is exposed to light through an opaque mask in the shape of the desired pattern. Upon development, the remaining film forms an adherent etch resistant coating on the slice in the pattern of the mask.

Most of the steps in semiconductor slice processing are highly automated. In one prior art system, the slice is provided with a "flat" about half an inch long at one point on its circumference to act as an index in the alignment of the slice for each of the exposure steps after coating. In that system, the slice is moved along an air track and urged against a pair of mechanical stops. The slice is then rotated by air jets until the flat on the slice aligns against a block. Proper alignment is sensed by movement of the slice further towards the block when alignment occurs. In this alignment, the slice is then secured to a vacuum chuck or turntable which is moved to the exposure station for final microscope-assisted manual alignment with the mask. The mask is then lowered into contact with the coated slice for exposure.

Although this system performed sufficiently accurate alignment, problems arose because of tiny chips broken off of the slices by the relatively rough handling of the slices. Chipping occurred when the slice came into contact with the mechanical stops and especially when the edge of the indexing flat of the rotating slice came into contact with the alignment block. The physical damage to the slice itself was usually inconsequential. However, the loose chips often became lodged in the mask and slice coating and were transferred to the mask and scratched or otherwise damaged the mask during the exposure step. This would not have been considered serious since the chips were usually so small that they ruined only a single device on a slice, but there was a cummulative effect. The chip scars in the mask soon built up to such a degree that many devices were ruined on every slice exposed through the damaged mask.

In the prealigner mechanism of the present invention, the wafer to be aligned is moved slowly and gently onto a vacuum chuck turntable and centered by being urged gently against an arcuate mechanical stop of a resilient material such as tetrafluoroethelyne polymer such as that sold under the trademark "Teflon". After centering, the slices are clamped to the chuck by a vacuum and the centering stop retracted. Thereafter, a sensor having three photodetectors is moved toward the slice until the forward most sensor detects the slice edge. Sensor movement is then stopped and the chuck and the slice rotated until the sensor no longer detects the wafer edge thus indicating the presence of the flat in the vicinity of the sensor. The sensor array is again advanced until the forward sensor again detects the slice edge. At this point, one of the other sensors should also detect the presence of the wafer thus indicating the direction for further rotation required for proper orientation of the slice. Rotation of the slice and advancement of the sensors is continued until the sensors on each side of the center sensor detect the slice edge simultaneously thus indicating alignment of the flat and correct orientation of the slice. The alignment procedure advantageously is controlled by a computer.

It is an object then of the present invention to provide a system for prealigning semiconductor slices in proper orientation for photoprocessing which is less damaging to the wafers than prior art systems.

It is a further object of the present invention to provide a system for prealignment of semiconductor slices which produces fewer semiconductor chips and less debris tending to damage photomasks used in subsequent processing steps.

It is a still further object of the present invention to provide a system for prealigning semiconductor slices which accomplishes such alignment faster than prior art systems.

It is a still further object of the present invention to provide a system for prealigning semiconductor slices which provides both greater slice throughput and improve yield over prior art systems.

These and other objects and advantages of the present invention will become apparent from the following detailed description when read in conjunction with the drawings wherein.

Figure 3:
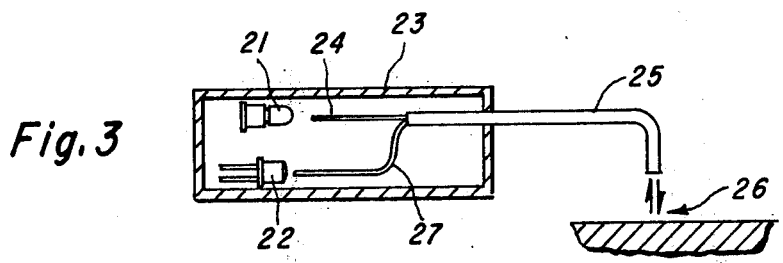
Figure 4A:
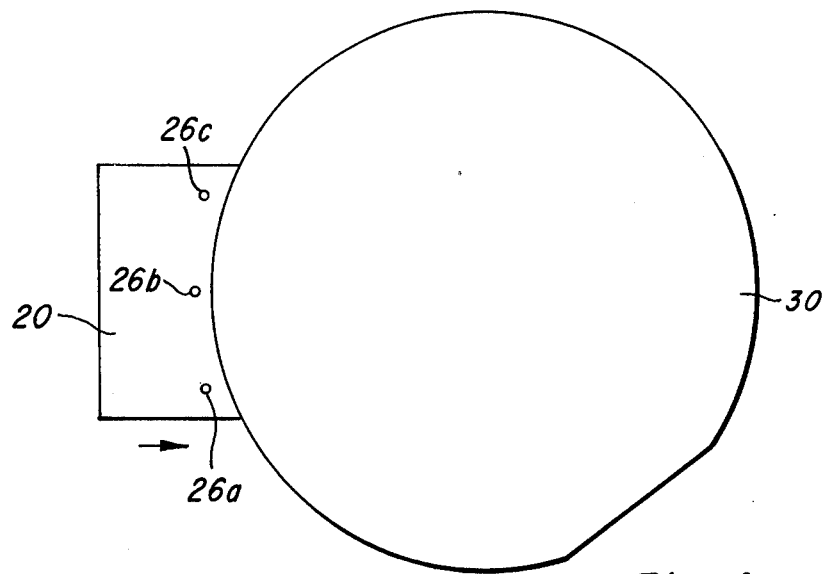
Figure 4B:
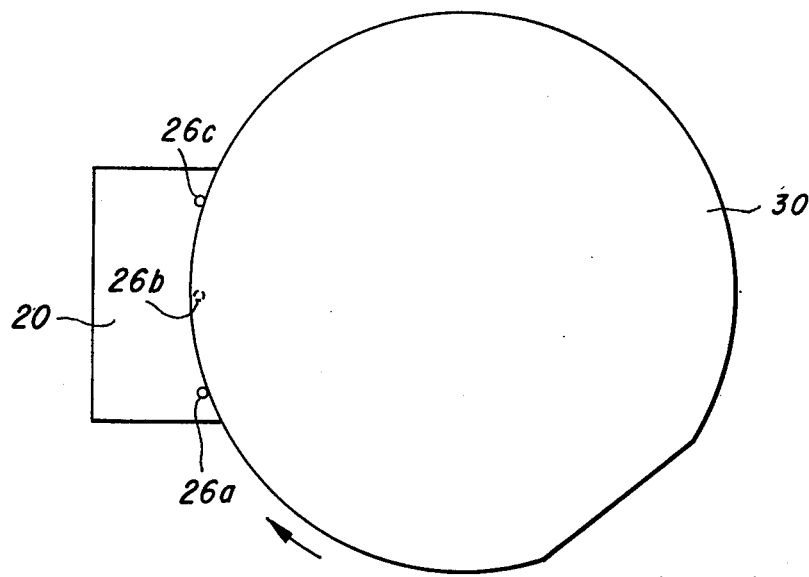
Figure 4C:
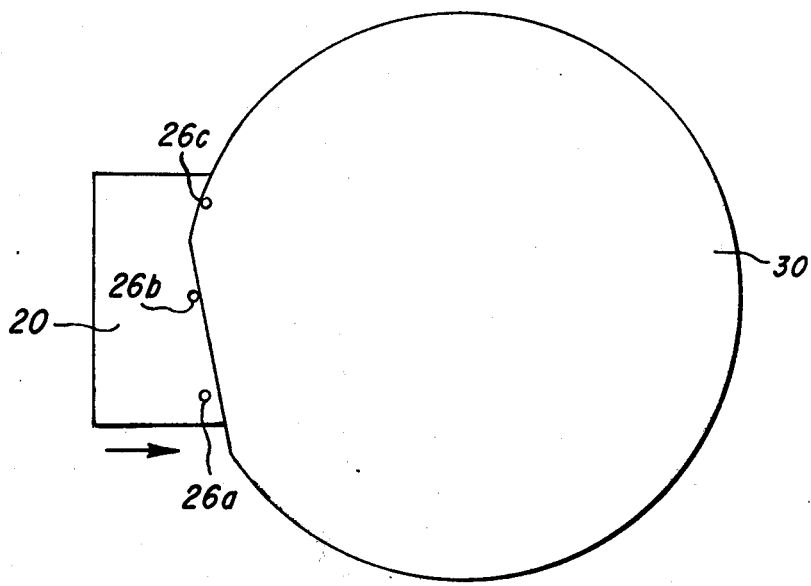
Figure 4D:
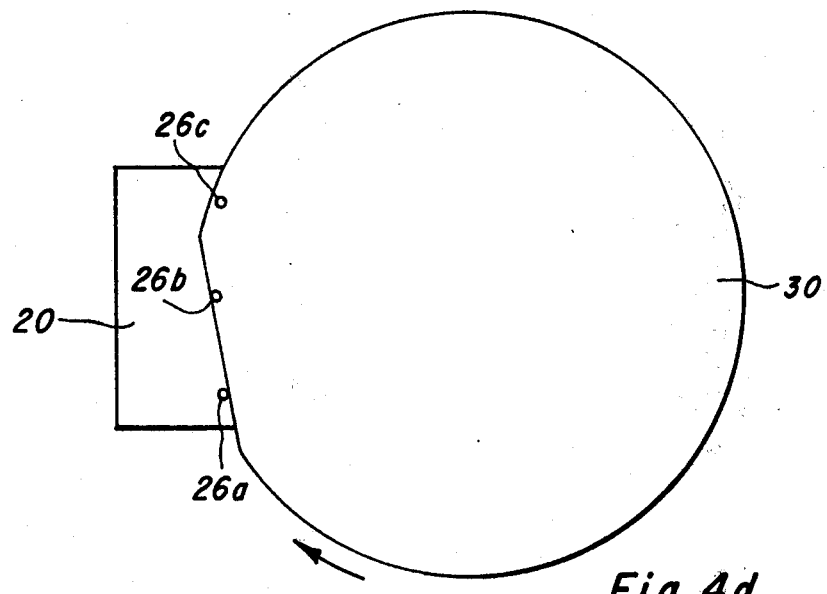
Figure 4E:
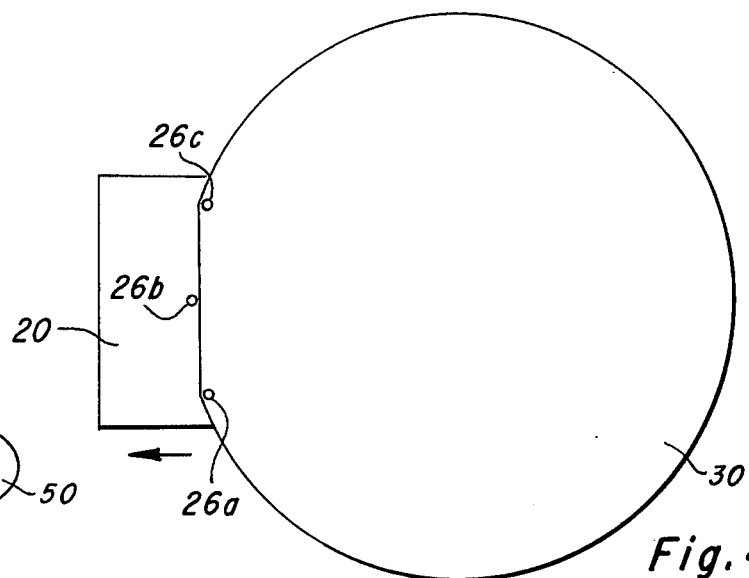
Figure 5:
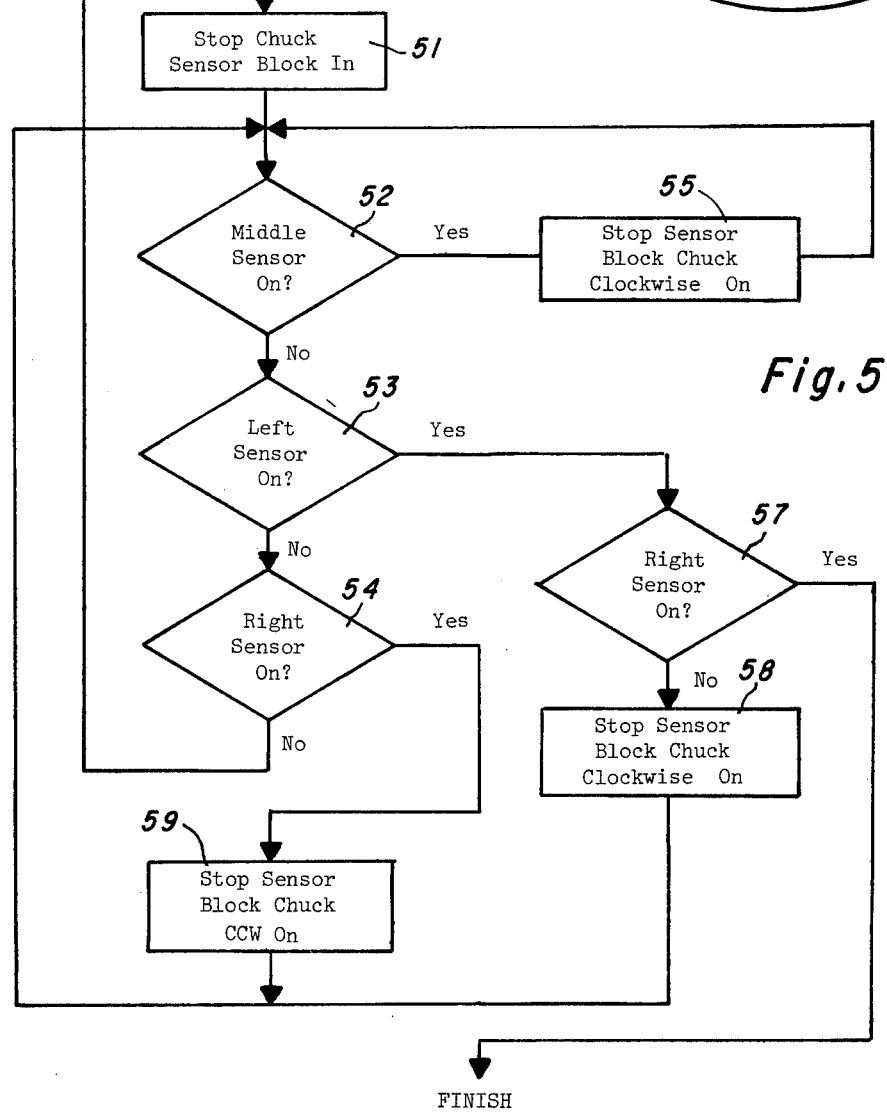

FIG. 3 schematically depicts in cross section one of the sensors of the rotational alignment system of the present invention;

FIGS. 4a–4e illustrate the relative positions of the semiconductor slice and rotational alignment sensors during the rotational alignment procedure; and FIG. 5 is a flow chart for the digital control system of the rotational alignment system of the present invention.

Figure 1A:
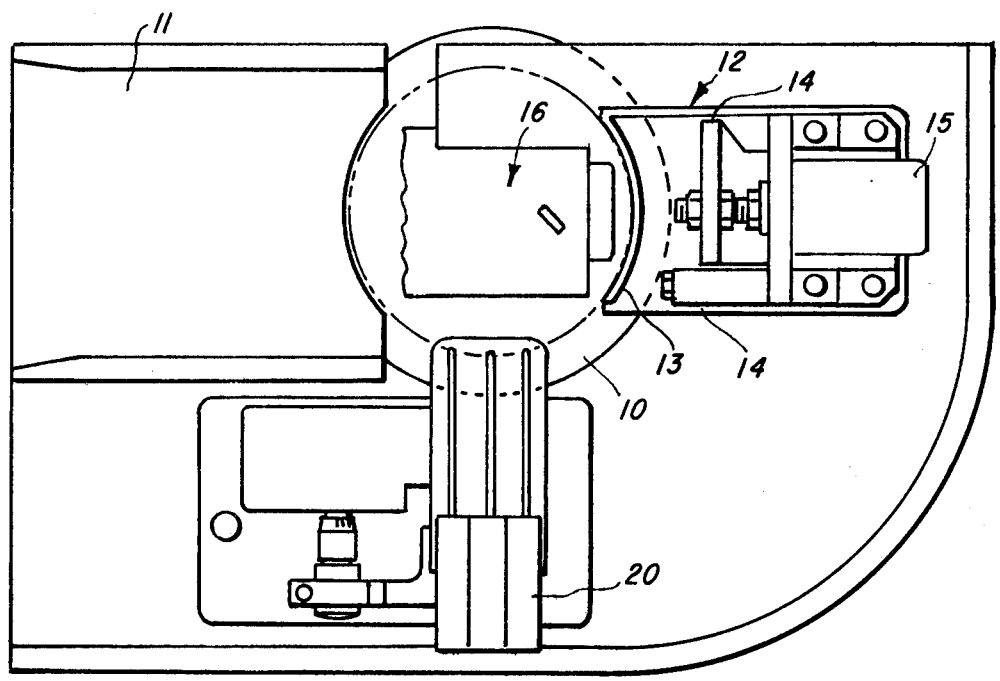
FIG. 1a is a top view of the prealignment system of the present invention.
Figure 1B:
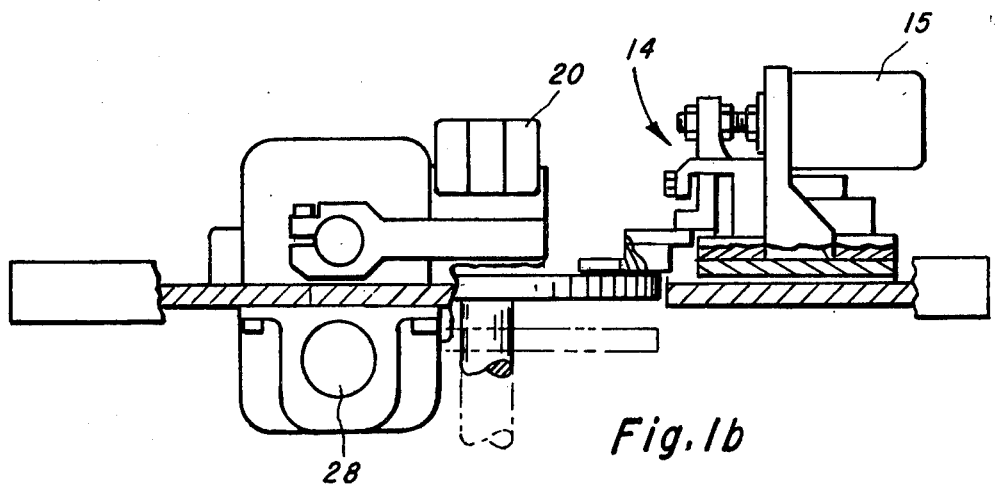
FIG. 1b is a side elevation view of the prealignment system of the present invention.

Referring now to FIGS. 1a and 1b, there is shown the prealigner mechanism of the present invention. As is common in prior art mechanisms of this type, a turntable 10 on which the wafer is to be oriented and aligned is mounted on a retractable pedestal (not shown) such that the turntable with the aligned wafer attached thereto can be automatically removed from the prealignment mechanism and moved into position for precise manual registration with a photomask and exposed to activating radiation. The turntable 10 is positioned in the alignment mechanism next to and at a surface level with a conveyor mechanism 11 used to deliver slices to the turntable. The conveyor 11 as illustrated may be of the "air track" type well known in the art wherein the wafer is supported and transported along the track on a film of fluid such as pressurized air supplied through small openings in the bed of the air track. However, other suitable conveyer means may be used.

In operation, the slice to be aligned is conveyed along the air track 11 at any desired rate which is reduced as the wafer approaches the turntable such that the wafer will come gently to rest on the turntable 10. Mounted over the turntable and precisely positioned with respect to the center of the turntable is a cushioned mechanical stop 12. The stop has an arcuate bumper 13 of a resilient material such as Teflon and extends from the mounting brackets 14 downward into contact with the turntable 10. The arc of the bumper 13 is of a radius matching the radius of the slice to be positioned, e.g. 3 inches plus the high side tolerance of the wafer, generally about 0.010 inches. The mounting bracket-bumper assembly is adapted to be moved toward and away from the center of the turntable 10 and to be positioned very accurately with respect thereto by a drive motor 15. The range of movement of the mechanical stop assembly is sufficient to allow the bumper to be withdrawn completely from contact with the turntable.

An "inverted" air track 16 is mounted over the turntable 10 preferably by hinges from the rails of the air track conveyer 11. The inverted air track comprises a plenum chamber receiving a supply of pressurized air from a source not shown. The bottom surface of the inverted air track has an array of small inclined openings between its surface and the plenum chamber so that air streams are expelled downwardly and in the direction of the mechanical stop 12. The turntable 10 is equipped similarly with a plenum chamber and a number of small openings between the surface of the turntable and the chamber. However, these openings are perpendicular to the surface and thus when pressurized air or other fluid is supplied to the plenum chamber a fluid cushion is established to support the wafer in place just above the surface of the turntable.

Thus, in operation a slice is moved along the conveyer 11 toward the turntable 10 at any desired controlled speed. As the slice approaches the turntable the speed of travel is reduced such as by changes in air pressure to the air track. The wafer arrives at the turn table with just sufficient speed to come to rest on the turntable. At this time the mechanical stop 12 may be precisely positioned on the turntable or at least positioned to prevent the wafer from overshooting the turntable. Thus, should the wafer be travelling too fast to coast to rest on the turntable 10 it will be stopped by the resilient bumper with almost no likelihood of damage or chipping of the slice.

Once the wafer has come to rest on the turntable air pressure is applied to the plenum chamber of the turntable so that the wafer is supported just above the turntable on an air cushion. At the same time, if the mechanical stop 12 has not already been precisely located to its indexing position it is moved to that position by activation of the drive motor 15. Pressurized air is then supplied to the inverted air track and because of this slant of the air passages to the surface the slice is gently urged against the precisely located bumper 13. Because of the shape and the size of the bumper 13 relative to the wafer, the wafer resting against the bumper will be located precisely in the center of the turntable. Because of the length of the arc and the arcuate radius of the bumper 13 the slice will be accurately positioned in both the "X" and "Y" directions even if the flat of the wafer is within the arc of the bumper. Photosensors or other suitable non-contact sensors may be used to indicate when the wafer is precisely centered on the turntable. Should the sensors indicate that for some reason the slice will not precisely center, a condition which could occur if the flat is against one end of the bumper, air pressure to the inverted track 16 and the bumper is removed and the turntable and slice rotated a short distance and the centering procedure repeated.

When the sensors indicate the wafer is correctly located and centered on the turntable the wafer is clamped to the turntable. This may be accomplished for example by applying a partial vacuum to the plenum chamber of the turntable or to an additional set of openings in the turntable especially for that purpose.

After the slice is centered on the turntable and clamped thereto, the bumper stop 13 is retracted by activation of the motor 15 preferably until the bumper is out of contact with the turntable.

The second step of the wafer alignment procedure is to orient precisely the flat of the slice. For this purpose, a moveable sensor block 20 is mounted on the alignment mechanism base. The sensor block 20, FIG. 2, includes at least 3 sensors which preferably may be reflective photosensors mounted in sensor assemblies 29 of the type shown in more detail in FIG. 3. Although other types of sensors may be used, the assemblies presently used comprise a light source 21 and a light sensor 22 mounted within an opaque enclosure 23 as illustrated in FIG. 3. A bundle of optical fibers 24 conduct the light from source 21 through conduit 25 to the sensing area at 26. A second bundle of optical fibers 27 conducts light reflected from the sensing area 26 back through the conduit 25 to the light sensor 22. Changes in the amount of light reflected from the sensing area 26 are detected by the sensor 22.

Figure 2:
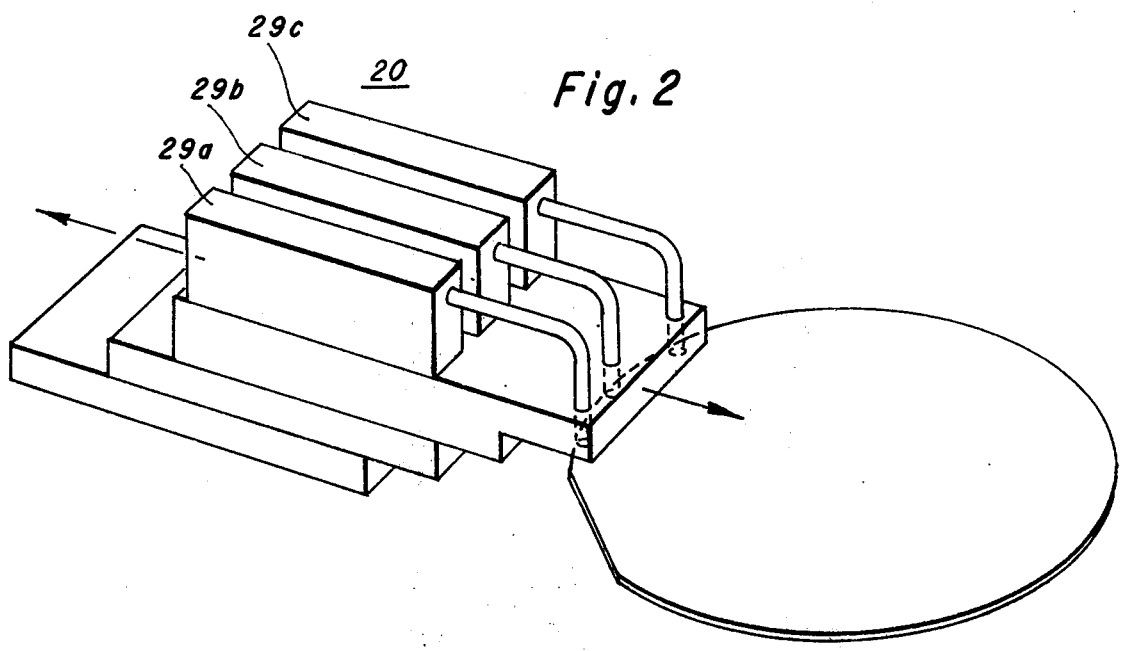
FIG. 2 is a somewhat schematic illustration, in perspective, showing the elements of the rotational alignment system of the present invention.

Three such sensor assemblies 29 are arranged on a moveable sensor block 20, FIG. 2, such that the sensing ends of the optical fiber bundles are arranged along an arc of a larger radius than that of the slice, preferably about two times as large. The sensor block 20 is mounted for movement along the common radii of the turntable and the sensor arc. Movement of the sensor block is controlled through activation of a reversible motor 28 arranged to drive the sensor block through a micrometer lead-screw arrangement which need not be detailed for purposes of the present invention. Suffice it to say the location of the sensors, or more exactly their sensing areas, with respect to the center of the turntable can be controlled in increments of about 0.001 inches.

The sequence of operations for orienting the flat of the slice is illustrated in FIGS. 4a–4e. In FIG. 4a, a slice 30 has been centered on the turn table and sensor block 20 which defines sensing areas 26a, 26b and 26c is activated to move toward the slice. In FIG. 4b, sensing area 26b has detected presence of the slice 30 and movement of the sensor block 20 has been stopped. Note that the sensing areas 26a and 26c are not yet within the area of the slice. The turntable bearing slice 30 is then rotated, for example clockwise, until the presence of the flat edge 31 of the slice arrives in the sensing area. Such a position is indicated when sensing area 26b no longer detects presence of the slice as shown in FIG. 4c. Thereupon rotation of the turntable and the slice is halted and the condition of sensing areas 26a and 26c determined. If neither of the sensing areas 26a or 26c indicate presence of the slice or if presence of the slice is indicated only in sensing area 26c, the sensor block again is advanced until the flat edge of the slice again enters sensing area 26b as shown in FIG. 4d. The sensors now indicate several bits of information about the position of the slice 30. Because both sensing areas 26b and 26c are within the area of the slice and sensing area 26a is not, there is an indication that the flat is not properly aligned since sensing areas 26a and 26c did not enter the slice area at the same time. Finally, the slice needs to be rotated further clockwise since sensing area 26c is within the slice area and sensing area 26a is not. This last bit of information is important in systems in which momentum of the turntable in rotation may cause overshoot to move the slice past the desired alignment position. Such a condition would be indicated and thus counter clockwise rotation needed when sensing area 26a showed within the slice area and sensing area 26c did not.

The actions of alternately incrementally rotating the slice and moving the sensor block toward the center of the turntable are repeated until indication is produced that sensing areas 26a and 26c are within the slice area and sensing area 26b is not. Such a position is illustrated in FIG. 4e. A slice in such position is properly oriented.

Although not necessary, a final check of the proper alignment of the slice may be conducted by determining if sensing areas 26a and 26c simultaneously exit the slice area as the sensor block is retracted. Should such a check indicate that the slice is not precisely aligned, the alignment procedure outlines above is repeated.

In the described embodiment of the present invention, rotation of the turntable is accomplished by means of a reversible electric motor arrangement as is well known in the prior art. Although other means of rotating the turntable may be used.

Necessary controls to carry out the alignment procedure outlined above may take the form of a "hard wired" electronic digital logic circuit or an appropriately programmed general purpose digital computer, either one of which may be interconnected to apply electrical power for operation of the various motors and pneumatic valves of the system and to receive electrical indications from the various sensors of the system.

FIG. 7 is a flow chart for such a digital logic circuit or a computer controlling operations for aligning the slice after centering as described above.

State 50 is achieved when the appropriate sensors indicate to the controller that the slice is centered on the turntable and the vacuum clamp is turned on. At state 51, the sensor block motor is activated and the sensor block is moved toward the slice by 0.001 inches. Then a check is made at state 52 to determine if the middle sensor 26b has detected the slice edge. If it has not, right and left sensors 26a and 26c respectively are checked at states 53 and 54. Unless the flat is already close to alignment as in FIGS. 4c–4e, sensors 26a and 26c are off and return is made to state 51. The sensor block is then moved another increment closer. When in state 52, indication is received that the middle sensor 26b has detected the slice edge, state 55 activates the turntable motor to turn the slice clockwise and the state 52–55 loop is repeated until the slice is in a position as in FIG. 4c such that the middle sensor 26b is off and left sensor 26c is on. Operation is then shifted to state 57 and a check made to see if right sensor 26a is on. If not, operation continues in loop 52, 55, 57, 58 with shifts to loop 52, 55 when appropriate until the position illustrated in FIG. 4e is achieved. Then, at state 52 sensor 26b will be off, at state 53 left sensor 26c will be on and at state 57 right sensor 26a will be on indicating that proper alignment of the slice is complete. Should the clockwise rotation of the slice overshoot, a possibility mentioned previously, sensor 26a would be on, 26b and 26c would be off. In such a situation, the system would go from state 54 to state 59 for counter clockwise rotation of the slice. Operation then continues in loop 52, 53, 54, 59 with appropriate shifts to loop 52, 55 until the aligned position of FIG. 4e is achieved as indicated by the final pass through state 52, 53, 57 to finish.

In some systems it has been found that the inertia of the turntable may cause "over shoot" in both rotational directions when the slice is very near its desired orientation. Such operation results in oscillation of the system about the final desired orientation. This form of undesirable operation can be presented by additional logic circuitry that slows the speed of the turntable motor slightly after each required reversal of direction. Logic circuitry for this purpose is well within the skill of those familiar with the art and need not be described here in detail.

Also, although the system has been described as operating to periodically start and stop the appropriate control motor with a condition check by a cycle of the logic control system during each stop period of the motor, it should be recognized that the system may be operated with equal effectivenes by continuous application of power to the appropriate motor until a change in the sensor condition indicates the motor should be stopped. Of course, the logic control system should "cycle" at a relatively high rate for this type of operation.

Thus, there has been disclosed a new semiconductor slice prealignment system which accomplishes slice orientation to an accuracy within 5 minutes of arc in an average time of about 3.5 seconds per slice as compared to an average time of about 5.5 seconds per slice for less accurate prior art systems, a slice alignment rate increase of more than fifty percent. Further, tests have shown that mask damage in the exposure operation has been considerably lessened. For example, after aligning only 10 slices in a prior art system inspection of the slices showed a total of 53 chips from the slice elges. Using the system of the present invention no chips could be detected after 50 alignments. Comparisons also showed that after alignment and exposure of 48 slices in a prior art system 5 chips were found adhering to the mask while 96 slice alignments and exposures in the system of the present invention produced only one chip adhering to the mask. The inference can thus be drawn then that usable mask life has been extended at least 10 fold.

It is to be recognized that only an illustrative embodiment of the present invention is shown and that changes and modifications still within the spirit of the invention will immediately occur to those skilled in the art. The present invention then is to be limited only as set forth in the following claims.

What is claimed is:

1. A system for accurately aligning a generally circular wafer member having a flat region along a portion of its periphery comprising:
   a. a turnable means mounted for rotation about a central axis perpendicular to its surface;
   b. conveyer means to deliver said wafer member gently to a position at rest on said turntable;

c. a moveable stop member including an arcuate bumper member of resilient cushioning material, the arc of said bumper being of essentially the same radius as that of said wafer member and of a length greater than the arc of said wafer member subtended by said flat region of its periphery;

d. means to move said stop member to various positions between and including a first position wherein the bottom edge of said bumper is in contact with said turntable and the center of the arc of said bumper member lies on said central perpendicular axis of said turntable and a second position in which said bumper member is sufficiently spaced from a wafer member centered on the axis of said turntable that rotation of said wafer member is not impeded by said bumper;

e. means providing a fluid film to support said wafer member just above said turntable;

f. means urging said wafer member into contact with said bumper member in said first position thereby centering said wafer for rotation;

g. sensor means indicating when said wafer is centered about said perpendicular axis;

h. means clamping said wafer to said turntable in said centered position;

i. controllable means to rotate said turntable about said central axis;

j. a sensor array mounted adjacent said turntable and having at least three sensors positioned to produce sensing areas in the plane of said wafer and along an arc of a circle having a radius co-linear with but larger than the radius of said wafer member and within a spacing no greater than the length of the flat region of said wafer periphery, the middle one of said sensing areas being nearest said perpendicular axis of said turntable;

k. controllable means to produce relative movement between said sensing areas and a centered wafer member in a direction parallel to said co-linear radii; and l. means responsive to all of said sensor means to control operations of said means to move said stop member, said means providing a fluid film, said means urging said wafer, said means clamping said wafer, said control means to rotate and said controllable means to produce relative movement.

2. The system as defined in claim 1 wherein said last mentioned means comprises logic circuitry.

3. The system defined in claim 1 wherein said last mentioned means comprises an appropriately programmed digital computer.

4. The system as defined in claim 1 wherein said means to move said stop member, said controllable means to rotate said turntable and said controllable means to produce relative movement are each reversible electric motors.

5. The system as defined in claim 1 wherein said means providing a fluid film comprises pressurized air streams impinging on the bottom surface of said wafer perpendicular thereto.

6. The system as defined in claim 1 wherein said means urging said wafer member comprises pressurized air streams impinging on the top surface of said wafer at an angle thereto in a direction toward said bumper member.

7. The system as defined in claim 1 wherein said means clamping said wafer comprises passages in said turntable between the surface thereof and a partial vacuum chamber.

8. A system for accurately aligning a generally circular wafer member having a flat region along a portion of its periphery comprising:

a. turntable means mounted for rotation about a central axis perpendicular to its surface;

b. fluid film conveyer means to deliver said wafer member to a position at rest on said turntable;

c. a moveable stop member including an arcuate bumper member of a resilient cushioning material, the arc of said bumper being essentially of the same radius as said wafer and of a length greater than the arc of said wafer member subtended by said flat portion of its periphery;

d. reversible electric motor means coupled to said stop member to move said stop member to various positions including a first position wherein the bottom edge of said bumper is in sufficiently close proximity to the surface of said turntable to block passage of said wafer member and the center of the arc of said bumper member lies on said central perpendicular axis of said turntable and a second position wherein said bumper member is located on the same radius of said turntable as in said first position but sufficiently removed from the center of said turntable that rotation of said turntable and wafer member are not impeded thereby;

e. means providing fluid film support of said wafer member just above said turntable comprising a plurality of pressurized air streams emanating from openings in the surface of said turntable in a direction perpendicular to said surface;

f. means urging said wafer member into contact with said bumper member in said first position thereby centering said wafer member for rotation with said turntable comprising a plurality of pressurized air streams impinging against the top surface of said wafer member at angles other than perpendicular to said surface and in directions toward said bumper member;

g. sensor means providing indication of a centered position of said wafer member;

h. means including openings in the surface of said turntable to apply a partial vacuum to the bottom surface of said wafer member thereby clamping said wafer member to said turntable;

i. reversible electric motor means coupled to rotate said turntable about said perpendicular axis;

j. a photosensor array mounted adjacent said turntable and having at least three sensors positioned to produce three equally spaced sensing areas in the plane of said wafer on an arc of a circle having a radius co-linear with an approximately twice the length of the radius of said wafer member, said sensing areas being within a spacing no greater than the length of said flat portion of the periphery of said wafer, the middle one of said sensing areas being nearest said perpendicular axis of said turntable;

k. reversible electric motor means coupled to produce relative movement between said sensing areas and said centered wafer member in a direction parallel to said co-linear radii; and l. logic circuitry responsive to the condition of all of said sensor means to control the operation of said conveyer means, said means providing fluid film support, said means urging said wafer member, said means to apply partial vacuum, and all of said reversible electric motor means.

9. A system as defined in claim 8 wherein said bumper means comprises polytetrafluoroethelyne.

10. The system as defined in claim 8 wherein said reversible electric motor means coupled to produce relative movement produces movement of said sensor array.

11. A system as defined in claim 8 wherein said logic circuitry comprises an appropriately programmed digital computer.

12. A method for accurately aligning a generally circular wafer member having a flat indexing region along its periphery comprising:
   a. delivering a wafer member onto the surface of the turntable;
   b. positioning an arcuate stop member having a radius substantially the same as that of said wafer member such that the center of the arc of said stop member lies on the perpendicular axis of rotation of said turntable and the lower edge of said stop member is in sufficient proximity to the surface of said turntable to prevent passage of said wafer;
   c. supporting said wafer just above said turntable by applying a plurality of pressurized air streams to the bottom surface of said wafer and normal thereto;
   d. urging said wafer into contact with said stop member along its periphery by applying a plurality of pressurized air jets at an angle to the upper surface of said wafer;
   e. thereafter applying a partial vacuum to the bottom surface of said wafer to clamp said wafer to said turntable;
   f. establishing at least three sensing areas adjacent said wafer, said sensing areas being in the plane of said wafer and arranged along an arc of a circle having a radius co-linear with but larger than the radius of said clamped wafer, a middle one of said sensing areas being closest to said perpendicular axis of said turntable;
   g. producing relative movement between said sensing areas and said clamped wafer toward each other along paths parallel to said co-linear radii until said middle one of said sensing areas moves onto said wafer;
   h. rotating said turntable until said middle sensing area moves off said wafer at said flat periphery region thereof;
   i. producing further relative movement between said sensing areas and said clamped wafer toward each other until said middle sensing area again moves onto said wafer;
   j. rotating said clamped wafer in a direction dependent upon which others of said plurality of sensing areas is on said wafer until said middle sensing area again moves off said wafer; and
   k. thereafter repeating steps i and j until relative positions of said sensing areas and said clamped wafer are such that said middle sensing area is not on said wafer and the others of said plurality of sensing areas are at least partially on said clamped wafer.

13. The method as defined in claim 12 further including the steps of
   aa. detecting the relative center location of said wafer before performing the step e of Claim 12;
   bb. allowing said wafer to come to rest on said turntable when said wafer is in an off center location;
   cc. rotating said turntable through a partial revolution;
   dd. thereafter repeating steps c-e of claim 12; and
   ee. subsequent to step k of claim 12 producing relative movement between said sensing areas and said clamped wafer away from each other along said paths and determining if corresponding sensing areas on opposite sides of said middle sensing area move off of said wafer simultaneously.

14. The method of claim 12 further including the step of removing said stop member from the vicinity of said wafer subsequent to step f.

15. The method of claim 13 further including the step of removing said stop member from the vicinity of said wafer subsequent to step f.

16. The method of claim 12 wherein said sensing areas are established in equally spaced relationship and said relative movements are produced by moving said sensing areas.

17. The method of claim 13 wherein said sensing areas are established in equally spaced relationship and said relative movements are produced by moving said sensing areas.

18. The method defined in claim 16 wherein said sensing areas are established in an arc having a radius essentially twice that of said clamped wafer.

19. The method defined in claim 17 wherein said sensing areas are established in an arc having a radius essentially twice that of said clamped wafer.

20. A system for accurately orienting a generally circular wafer member having a flat region along at least a portion of its periphery comprising;
   a. controllable means to rotate said wafer member about its perpendicular central axis;
   b. a sensor array having a plurality of sensors so mounted as to produce at least three sensing areas in the plane of said wafer member and along an arc of a circle of a radius co-linear with but larger than the radius of said wafer member and within a spacing no greater than the length of said flat portion on the periphery of said wafer member, the middle one of said sensing areas being nearest said perpendicular axis;
   c. controllable means to produce relative movement between said sensor areas and said wafer member in a direction parallel to said co-linear radii;
   d. means responsive to the condition of said sensors of said array to control said controllable means to rotate and said controllable means to produce relative movement.

21. A system as defined in claim 20 wherein said sensing areas are equally spaced.

22. A system as defined in claim 21 wherein said middle sensing area lies on the line of said co-linear radii.

23. A system as defined in claim 22 wherein said controllable means comprise reversible electric motors and said means responsive to the condition of said sensors comprises logic circuitry controlling the application of power to said motors.

24. A system as defined in claim 20 wherein the radius of the arc of said circle is approximately twice that of said wafer member.

25. A system as defined in claim 21 wherein the radius of the arc of said circle is approximately twice that of said wafer member.

26. A system as defined in claim 23 wherein said logic circuitry comprises an appropriately programmed digital computer.

27. The method of rotationally orienting a generally circular wafer member having a flat region along its periphery comprising:
   a. mounting said wafer member for rotation about its central axis normal to its surface;
   b. establishing three sensing areas adjacent said wafer, said sensing areas being in the plane of said wafer and arranged along an arc of a circle having a radius co-linear with and larger than a radius of said wafer, the middle of said sensing areas being closest to said central axis;
   c. producing relative movement between said sensing areas and said wafer to bring them closer together in paths parallel to said co-linear radii until said middle sensing area moves onto said wafer;
   d. rotating said wafer until said middle sensing area moves off of said wafer at said flat peripheral region;
   e. producing further relative movement between said sensing areas and said wafer toward each other along said paths until said middle sensing area again moves onto said wafer;
   f. rotating said wafer in a direction dependent upon which other of said three sensing areas is on said wafer and until said middle sensing area again moves off of said wafer; and
   g. thereafter repeating steps e and f until the relative position of said sensing areas and said wafer are such that said middle sensing area is not on said wafer and the other two of said sensing areas are on said wafer.

28. The method as defined in claim 27 further comprising the additional step of
   h. producing relative movement between said sensing area and said wafer apart along said paths and determining if said other two sensing areas move off of said wafer simultaneously.

29. The method as defined in claim 27 wherein said relative movement is produced by moving said sensing areas.

30. The method as defined in claim 28 wherein said relative movement is produced by moving said sensing areas.

31. The method as defined in claim 27 wherein said sensing areas are established in equally spaced relationship.

32. The method as defined in claim 28 wherein said sensing areas are established in equally spaced relationship.

33. The method as defined in claim 27 wherein said sensing areas are established in an arc having a radius approximately twice that of said wafer.

34. The method as defined in claim 28 wherein said sensing areas are established on an arc having a radius approximately twice that of said wafer.

35. The method as defined in claim 31 wherein said sensing areas are established in an arc having a radius approximately twice that of said wafer.

36. The method as defined in claim 32 wherein said sensing areas are established in an arc having a radius approximately twice that of said wafer.

37. The method of centering a generally circular wafer member having a flat region along its periphery on a turntable comprising the steps of:
   a. transporting said wafer member along a conveyor toward said turntable at a speed just sufficient to allow said wafer to come to rest on said turntable;
   b. moving an arcuate cushioned bumper member into a position on said turntable at which said wafer will be centered for rotation when said wafer is in contact with the arc of said bumper along a portion of its periphery;
   c. supporting said wafer in place just above the surface of said turntable by applying a plurality of pressurized air streams to the bottom surface of said wafer;
   d. urging said wafer into contact with said bumper member along its periphery by applying a plurality of pressurized air streams at an angle to the upper surface of said wafer;
   e. determining whether said wafer is in an off-center location by reason of said flat region being in contact with one end of said bumper or if said wafer is in a centered location;
   f. applying a partial vacuum to the bottom surface of said wafer to clamp said wafer to said turntable in response to the detection of said wafer at a centered location;
   g. allowing said wafer to come to rest on the surface of said turntable responsive to the detection of an off-center location;
   h. rotating said turntable through a partial revolution; and
   i. thereafter repeating steps c through g.

38. The method as defined in claim 37 further comprising the step of removing the bumper from the vicinity of said wafer after clamping said wafer to said turntable.

39. A system for accurately centering a circular wafer member having a flat region along a portion of its periphery comprising:
   a. a turntable member having an axis of rotation perpendicular to its surface;
   b. conveyer means to deliver said wafer to said turntable;
   c. moveable stop member including an arcuate bumper member of resilient cushioning material, the arc of said bumper being essentially of the same radius as said wafer member and of a length greater than the arc of said wafer member subtended by said flat region;
   d. means to position said stop member on said turntable such that the center of the arc of said bumper member lies on said axis of rotation;
   e. means providing a fluid film to support said wafer member just above said turntable; and
   f. means urging said wafer member into contact with said bumper member thereby centering said wafer for rotation.

40. A system for accurately centering a circular wafer member as defined in claim 39 further including means to detect off center location of said wafer when urged against said bumper and to incrementally rotate said wafer until said wafer is centered when urged against said bumper.

41. A system for accurately centering a circular wafer member as defined in claim 39 wherein said means urging said wafer member against said bumper member and said means providing a fluid film are pressurized air streams.

42. A system for accurately centering a circular wafer member as defined in claim 40 wherein said means urging said wafer member against said bumper member and said means providing a fluid film are pressurized air streams.

43. A system for accurately centering a circular wafer member as defined in claim 39 wherein said means providing fluid film comprises pressurized air streams impinging on the bottom surface of said wafer in a direction normal thereto.

44. A system for accurately centering a circular wafer member as defined in claim 39 wherein said means urging said wafer member against said bumper member comprises pressurized air streams impinging on the upper surface of said wafer member at an angle thereto and in the direction of said bumper member.

45. A system for accurately centering a circular wafer member as defined in claim 40 wherein said means providing a fluid film comprises pressurized air streams impinging on the bottom surface of said wafer in a direction normal thereto and said means urging said wafer member against said bumper member comprises pressurized air streams impinging on the upper surface of said wafer member at an angle thereto and in the direction of said member.

46. A system as defined in claim 39 further comprising means to clamp said wafer member to said turntable in contact with said bumper member.

47. A system as defined in claim 40 further comprising means to clamp said wafer member to said turntable in a centered position in contact with said bumper member.

48. A system as defined in claim 45 further comprising means to clamp said wafer member to said turntable in a centered position in contact with said bumper member.

49. A system as defined in claim 46 wherein said means to clamp comprises means for applying a partial vacuum to the bottom surface of said wafer member.

50. A system as defined in claim 47 wherein said means to clamp comprises means for applying a partial vacuum to the bottom surface of said wafer member.

51. A system as defined in claim 48 wherein said means to clamp comprises means for applying a partial vacuum to the bottom surface of said wafer member.

* * * * *